(12) United States Patent
Larsen

(10) Patent No.: US 6,718,034 B1
(45) Date of Patent: Apr. 6, 2004

(54) HEADSET INTERFACE

(75) Inventor: Leo Larsen, Kokkedal (DK)

(73) Assignee: GN Netcom A/S, Kobenhavn (DK)

( * ) Notice: Subject to any disclaimer, the term of this patent is extended or adjusted under 35 U.S.C. 154(b) by 0 days.

(21) Appl. No.: 09/230,495

(22) PCT Filed: Jul. 2, 1997

(86) PCT No.: PCT/DK97/00289

§ 371 (c)(1),
(2), (4) Date: May 10, 1999

(87) PCT Pub. No.: WO98/07233

PCT Pub. Date: Feb. 19, 1998

(30) Foreign Application Priority Data

Jul. 30, 1996 (DK) .............................. 0821/96

(51) Int. Cl.⁷ ................................ H03G 3/20
(52) U.S. Cl. ................................ 379/390.01
(58) Field of Search .................... 379/390.01

(56) References Cited

U.S. PATENT DOCUMENTS 5,734,713 A * 3/1998 Mauney et al. ........ 379/392.01
5,892,823 A * 4/1999 Stelman ................. 379/390.01
5,896,451 A * 4/1999 Deas ..................... 379/390.01

* cited by examiner

Primary Examiner—Forester W. Isen
Assistant Examiner—Daniel Swerdlow
(74) Attorney, Agent, or Firm—Altera Law Group LLC

(57) ABSTRACT

The present invention concerns an adaptive headset interface for amplification and adjustment of signals between a random headset and a random terminal. The adaptive headset interface comprises digital signal processors, and is further equipped with a modem block over which the adaptive headset can be programmed by a call to a computer over the telephone net, whereby instructions as well as test signals are transferred between the computer and the adaptive headset interface, so that an adjustment is achieved which takes into account the signal transfer in relation to a reference telephone line corresponding to a given standard, or an adjustment which corresponds to the levels which apply for the relevant terminal to which the adaptive headset interface is connected.

10 Claims, 4 Drawing Sheets

Figure 1:
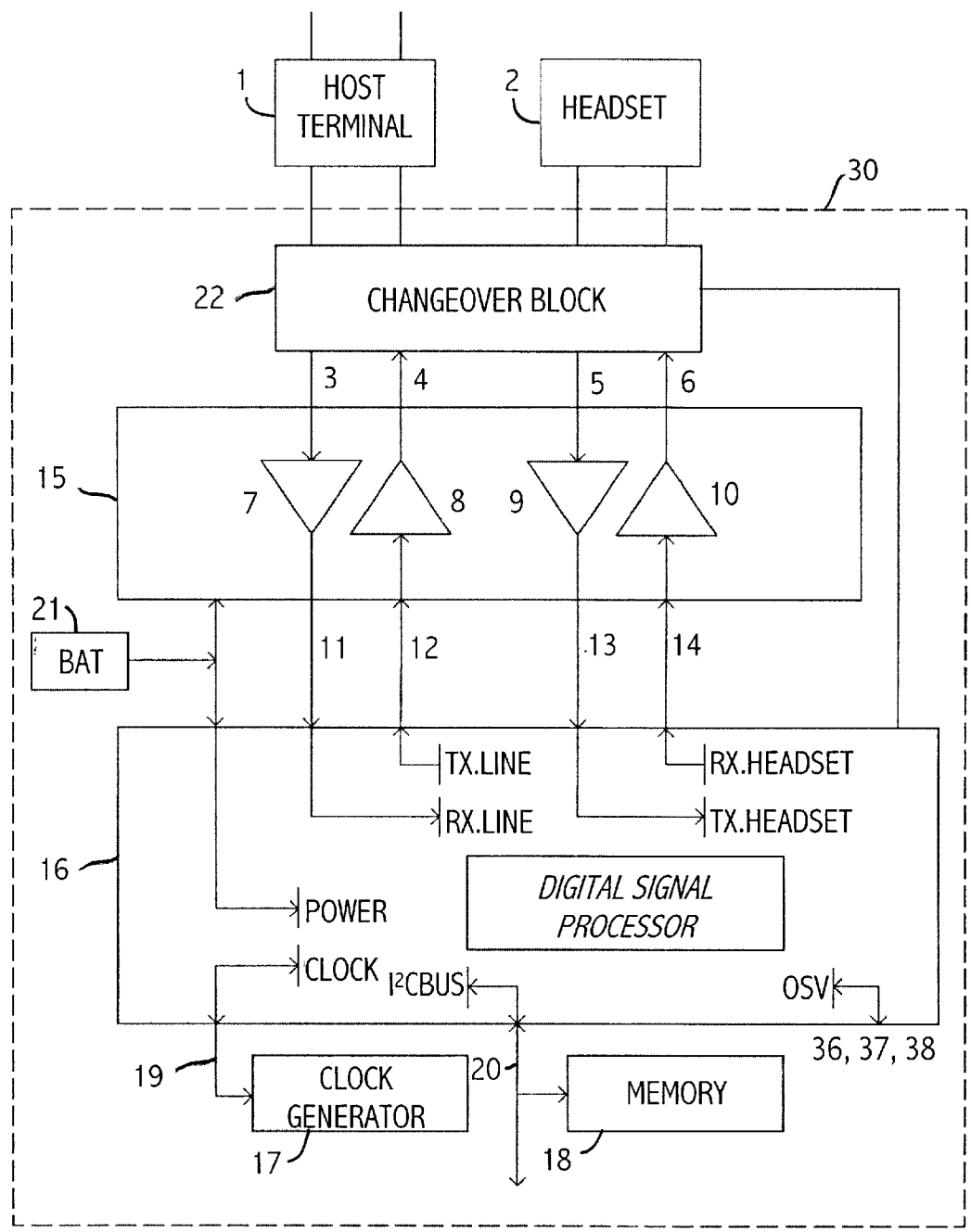

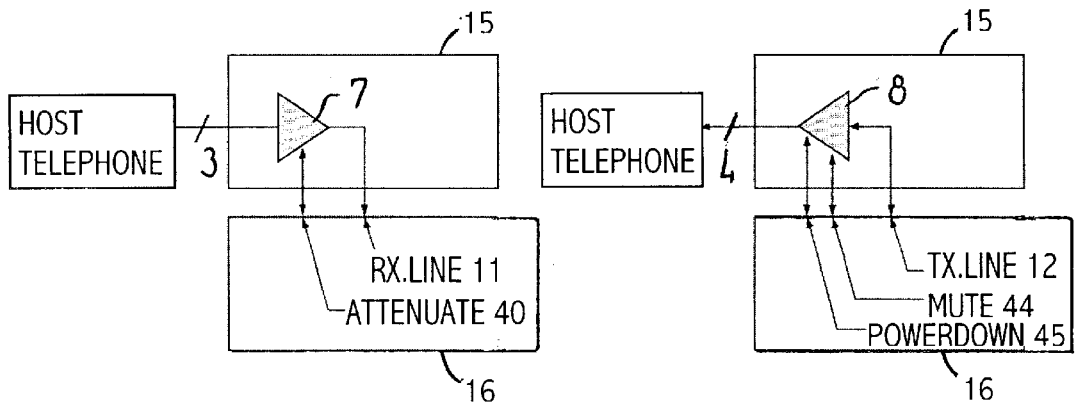
FIG. 3
FIG. 4
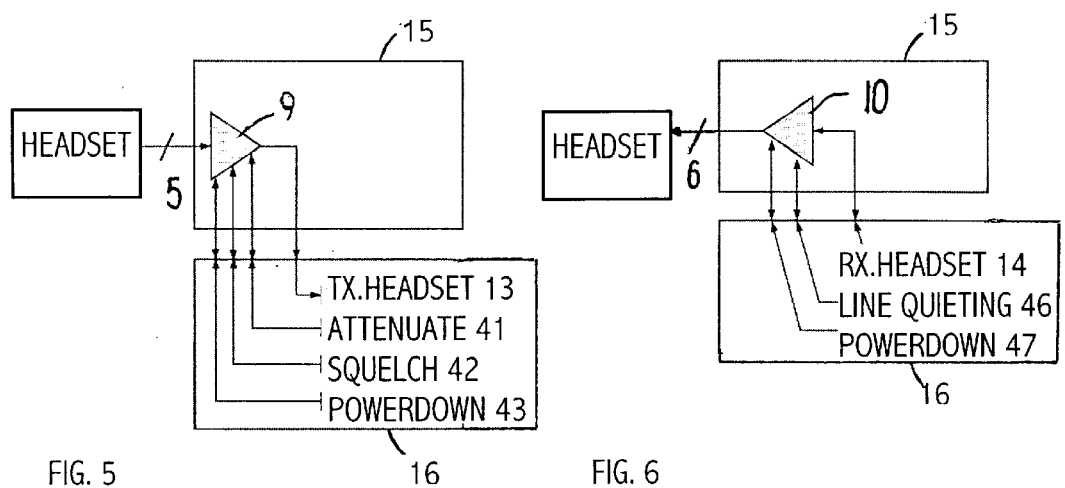
FIG. 5
FIG. 6

HEADSET INTERFACE

The present invention concerns an adaptive headset interface for connection between any host terminal and a so-called headset as defined in claim 1, and methods for the calibration of the headset interface as defined in claims 10 and 11.

Headsets are used as an alternative to the conventional hand-held telephones or handsets which comprise a microphone and a loudspeaker, by users who typically use the telephone for many hours during the course of the day, and by users who because of their work situation have their hands occupied with something else and are therefore engaged, or by users who find that headsets are more comfortable.

It is desirable to be able to connect a headset to different types of host terminals. However, these different types of host terminals have varying sensitivity and amplification, the reason being that the host terminal is adapted in accordance with individual microphone and loudspeaker specifications.

In document WO/95/26604 there is described an adaptive headset which can generate adjusted signal levels between the host terminal's normal connection to its microphone/loudspeaker and the connection to the headset. This adaptive interface contains a processor which generates a series of test signals with varying values of amplitude which are sent to the host terminal. The generated signals are monitored by the processor by means of the host telephone's sidetone coupling, in that the processor analyses the sidetone and determines when a clipping of the transmitted test signal occurs. The amplitude of the microphone signal is adjusted automatically to an output level which is sufficiently high and herewith free of noise, but without any overdriving of the host telephone's microphone input circuit.

This document forms the basis for the introductory part of claim 1.

The object of the present invention is to provide methods for the mode of operation of a headset interface, and an apparatus herefor which is able to offer an improved adaptation between the headset and the terminal while taking into account a coupled reference telephone line which is representative of a country-specific standard, and which is further able to adjust any headset to suit any host terminal complying with a country-specific standard for telephone apparatus. It is also an object of the invention to provide an apparatus with a set-up and calibration which requires a minimum of operation.

These objects are achieved with an apparatus as defined in claim 1 and by the methods according to the claims 9 and 10.

It is a further object to provide a headset interface which, despite its complex mode of operation, is simple to produce. This object is achieved through claim 2.

It is a further object of the present invention to provide a headset interface having a set-up and calibration which is independent of the type or the standard for the connectors of the host terminal which is used. This object is achieved through claims 3 and 11.

Figure 2:
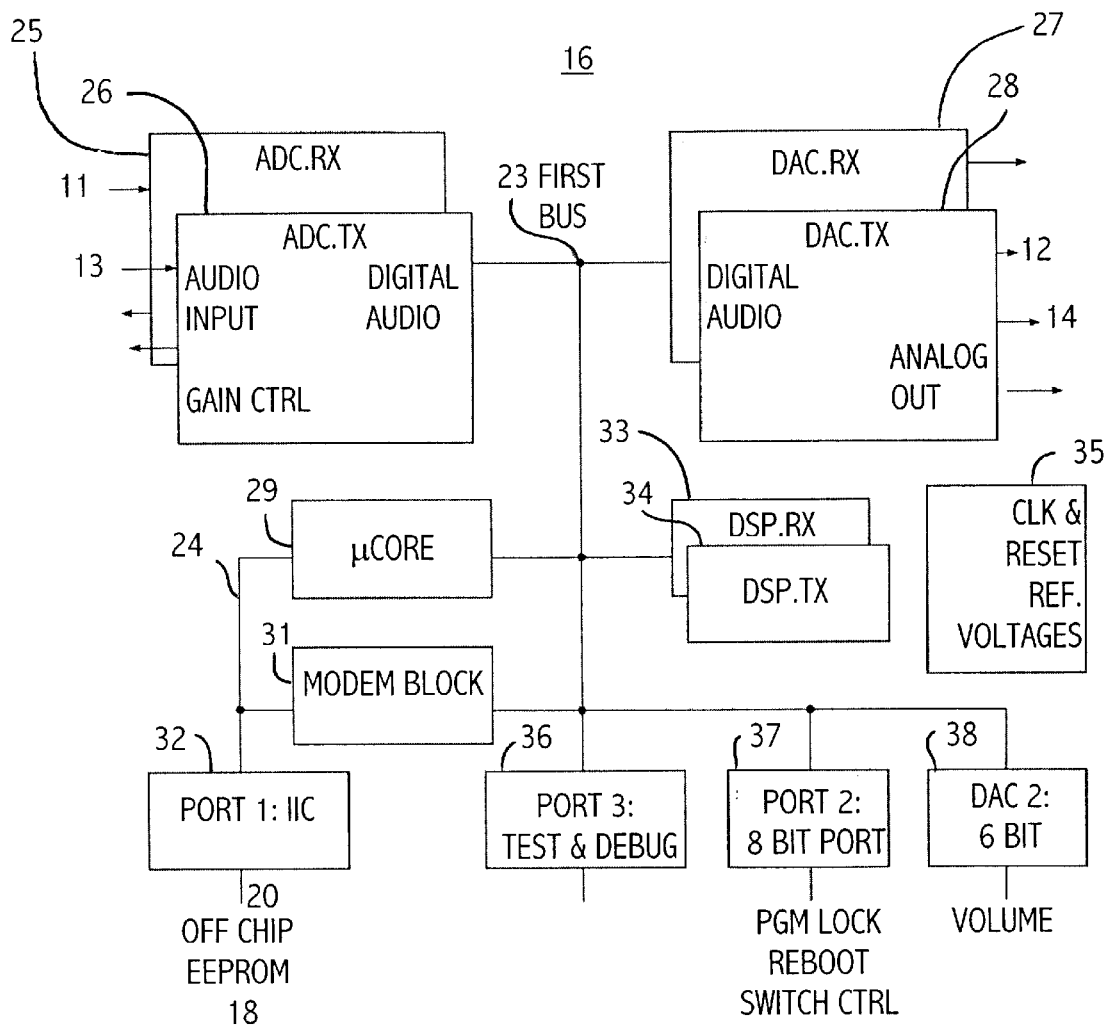
Figure 7:
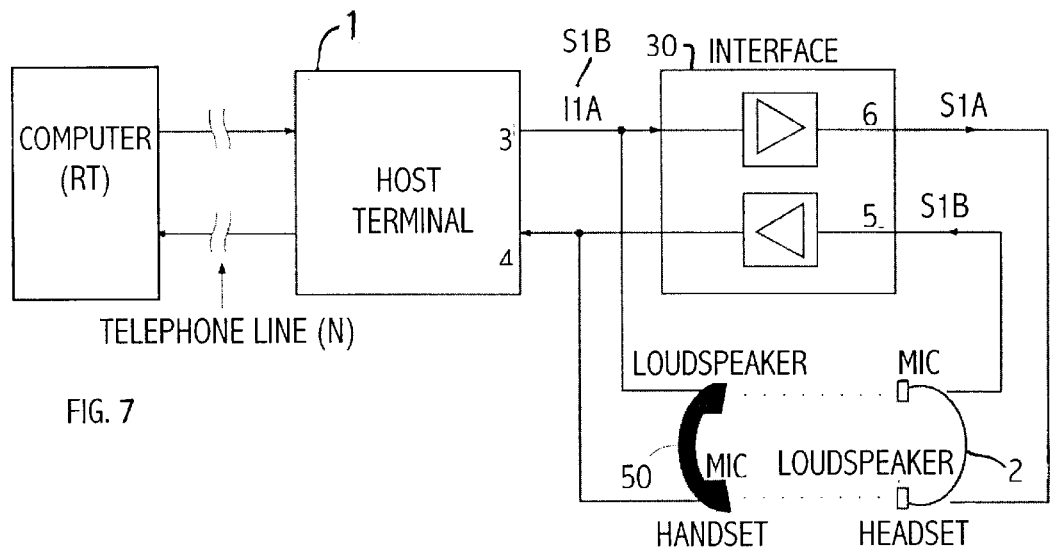
Figure 8:
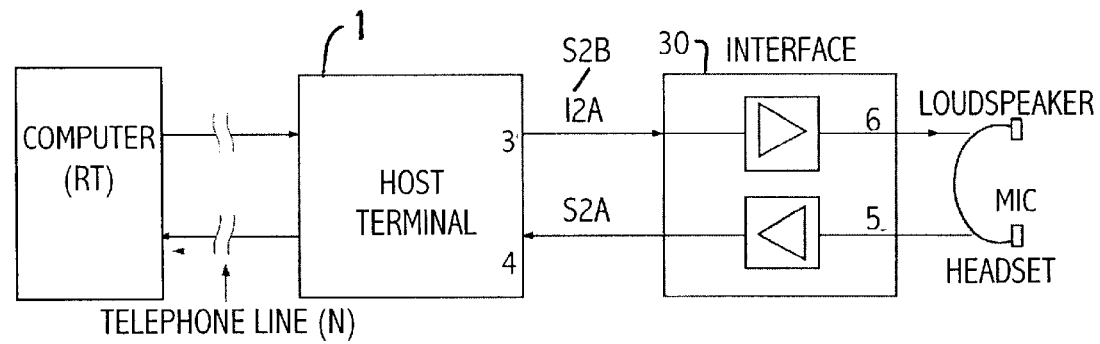

In the following, the invention is described in more detail with reference to the drawing, in that FIG. 1 shows a schematic presentation of the configuration of the adaptive interface and its connections to the host terminal, the battery supply, the clock generator and the external memory, FIG. 2 shows the configuration of the processor circuit containing digital microprocessors and the connections herefor, FIG. 3 shows the preamplifier which is connected to the host terminal's receive or RX output terminal, FIG. 4 shows the output amplifier which is connected to the host terminal's transmit or TX input terminal, FIG. 5 shows the preamplifier which is connected to the headset's microphone output, FIG. 6 shows the output amplifier which is connected to the loudspeaker in the headset, FIG. 7 is a schematic presentation of the signal paths with a first adjustment procedure, and FIG. 8 is a schematic presentation of the signal paths with a second adjustment procedure.

In FIG. 1 is seen a schematic presentation of the configuration of the adaptive interface 30 which is inserted between the terminals for output 3 and input 4 on a host terminal 1, which for example could be a conventional telephone apparatus, and the terminals to the microphone terminal 5 and the loudspeaker terminal 6 on a headset 2.

The adaptive interface 30 is built up of an amplifier circuit 15 to which the host terminal 1 and the headset 2 are connected, and a control and signal processing circuit 16 to which is connected a clock generator 17, an external memory 18, a battery unit 21, which could possibly be replaced by another type of power supply, and various input and output ports for external use.

The amplifier circuit 15 represents the outermost shell of electronics and consists of the four separate amplifiers 7, 8, 9 and 10 which, via connections shown in FIGS. 3–6, are controlled by the control and signal processing circuit, also called the processor unit 16. These amplifiers will be discussed individually in the following.

The adaptive headset interface consists mainly of two signal paths, the first of which comprises the microphone in the headset 2, an input amplifier 9, signal processing in a first link, and output amplifier 8 to the output line of the host terminal. This path is called the transmission signal path or the TX.line signal. The second signal path comprises the signal 3 which is received by the host terminal and is amplified by an input amplifier 7, which is processed in a second signal processing link, and which is finally amplified in an output amplifier 10 and received by the headset loudspeaker. This signal path is called the receive signal path or the RX.line signal.

These individual elements will now be described with reference to the drawing.

The amplifier 7 amplifies the RX.line signal which is transferred from the host terminal 1. The amplification is nominally 20 dB and can be damped via an attenuation signal 40 which is transferred from the control and signal processing circuit 16. This circuit 16, under programme control, constantly regulates the attenuation of the RX.line signal 11, so that the signal is adapted for a subsequent A/D conversion of typically 12–13 bits, which will be described in more detail in the following. This automatic gain control (AGC) function is controlled by the control and signal processing circuit 16, so that so-called "attack" and "release" sequences, which can also be expressed as the time constants of the amplifier's transfer function, are programmable.

The amplifier 8 amplifies, typically with 8 dB, the signal-processed TX.line signal 12 which originally stems from the headset's microphone. The amplifier 8 is supplied with a mute signal 44, which attenuates the output, and a power-down signal 45 which is used to save current when there is no signal through the amplifier. In addition, there is a bias current signal which gives rise to a change between class A/B and class A operation.

The signal TX.headset 5 from the headset microphone is amplified in the amplifier 9 with nominally 15 dB, and is digitally controlled by means of an attenuation signal 41 transmitted from the processor circuit 16 following the same principle as the RX.line signal described above for the adjustment of the signal level for subsequent A/D conversion. Moreover, under control of the control and signal processing circuit 16, the signal can be attenuated a further 11 dB by a squelch signal 42.

The headset's loudspeaker 6 is driven by the amplifier 10 with an amplification of nominally 12 dB, which can be controlled across a line-quieting signal 46 and a current-saving power-down signal 47, both of which are derived from the control and signal processing circuit 16. In addition, there is a bias current signal (not shown) which gives rise to a change between class A/B and class A operation.

The amplifier circuit 15 is further coupled to a changeover block 22, across which the headset 2 and the host terminal 1 are connected. During the exchange of various identification signals which are respectively transmitted and received by the processor unit 16 over the telephone net, the connectors on the changeover block 22 can via control signals transmitted from the processor unit be made to change until correct connection is achieved, regardless of whichever standard the host telephone and headset may be subject to.

The architecture and the mode of operation of the control and signal processing circuit 16, which in addition to the digital signal processing of the RX.line signal 11 and the TX.headset signal 13 also handles all control functions, will in the following be described with reference to FIG. 2.

A first A/D converter 25 is supplied with the RX.line signal from the host terminal 1, and a second A/D converter 26 is supplied with the TX.headset signal 13 from the headset 2. The converted signals are fed to a respective digital processor 33 (DSP.RX) and a respective digital processor 34 (DSP.TX) where the digital signal processing takes place. Thereafter, the respective signals are converted by the D/A converters 27 and 28, where they are sent further to TX.line 12 and RX.headset 14, respectively.

Since the requirements for the processing of the RX and TX signals are close to be being identical, it is advantageous to use identical hardware in the two signal paths. The hardware is configured in such a way that compensation can be made by means of software for apparently incompatible requirements.

Therefore, the RX signal paths and the TX signal paths are built up of a pair of ADC, DSP, and DAC blocks. These three-element pairs are connected by a common data parallel bus 23.

A µCore controller 29 controls all internal resources (apart from an IIC port 32) via this same bus 23. This includes a parallel port 36 for test and debug purposes, and an 8-pin digital low-power current-mode input/output port 37 for various tasks, including protection against unintentional re-programming.

The bus 23 is implemented as a programmable circuit, the object of which is to establish the necessary data transfer capacity in a flexible and economic manner. The structure alternately establishes a connection between a data source and a data user in accordance with a sequence stored in a so-called arbitration circuit in bus 23. Both data and handshake signals are transferred by bus 23 which is programmed via the µCore 29.

Since the connection is established and eliminated automatically by bus 23, the individual data sources have neither control nor knowledge concerning where the data is sent. Seen from the individual data source and data user, there is no difference between communicating on bus 23 or a hardwired connection. This contributes towards a simple design. However, the individual elements implement a handshake sequence to ensure that the transfer of data is always deferred until the data user has been established.

The bus 23 is used in the following manner: The arbiter of bus 23 initiates a transfer by broadcasting the number of the next connection. This broadcasting is effected over a 6-bit wide bus, which can thus distinguish between 64 different connections. The broadcast is effected at the same time that the data is transferred, so that the data source and the data user can get ready to commence communication as soon as the preceding connection is broken. The data source then writes out a 10-bit data word on the bus per clock cycle, i.e. at an internal clock frequency of 256 kHz. The data user reads data synchronously herewith. The data source marks the last data word with EOT (end of transmission).

The bus 24 is a serial bus which in protocol and capacity is adjusted to the IIC standard. The bus is accessible from outside, to where it is possible to directly connect a memory element such as an EEPROM and test equipment as required.

ADC 25/26 is a relatively complex block with several functions.

1. A/D conversion and band limitation of the audio signal.

2. D/A conversion with digital control of the bias currents 40/41 to the external preamplifiers. These currents define the gain of the preamplifiers.

3. "Wake-up" circuit which in power-down mode compares the input signal with a programmed reference.

ADC 25/26 contains a 2nd-order sigma-delta converter and a 3rd-order cam filter. Sampling is effected at e.g. 256 kHz or higher.

DAC 27/28 is a multiplying D/A converter, i.e. DAC 27/28 has two inputs, the first of which is used for the audio signal and the second for defining the conversion ratio between the digital audio signal and the analogue potentials (volts per bit).

DAC 27/28 contains a 3rd-order pulse density modulator (PDM), i.e. a converter which converts a 10-bit 16 kHz audio signal to a 256 kHz 1-bit signal, and then converts this to an analogue signal through a 1-bit converter.

DSP 33/34 is a small, programmable calculation circuit optimized for 2nd-order biquad filtering, i.e. optimized for series-coupled 2-poled IIR filters. Its calculation circuit contains a multiplier and an adder, so that in each clock cycle it can carry out the following algebraic function on 10-bit-signed integers:

$$z := x + Cy$$

where x is limited to be −1, 0 or 1 or identical with the contents of an accumulator, and where z, y and C lie in an input/output register block.

DSP's memory 33/34 can hold a number of programmed instructions which are executed automatically when its input registers are allotted new contents, and its output registers are empty. The contents of the input registers are allotted either via bus 23 or by one of DSP1's own programmes.

The µCore 29 is a more general intruction processor. It is built up following the same interface concept as DSP 33/34, i.e. the µCore 29 contains a number of small programmes which are executed automatically when input exists, but providing that there is room to deliver output. The main task of the µCore is to carry out automatic gain control, (AGC) calculations.

The modem block 31 is implemented as a master on the IIC bus 24. It is activated/deactivated when an input register on bus 23 is written to. When the modem block 31 is activated, its RX part and its TX part will wake up. The RX part will register 1200 baud signals on the RX.line, store a suitable sequence of these in a fifo, check the sequence with a checksum and, if the code is correct, send the received signal further on the IIC bus 24. Otherwise the sequence is ignored. The TX part will transmit all the sequences it receives via the IIC bus 24 as 1200 baud signals to the TX.line. The modem block 31 is used to communicate via the RX and TX signal over the telephone line to which the host terminal is coupled.

DAC2 38 is a simple and slow resistance monitor with bus 23 interface. This is envisaged to be used to register the user's volume setting across an external potentiometer.

The following is a description of the function of the adaptive interface.

Without further instructions the user of the headset couples the interface between the terminals on the headset and the host terminal.

Hereafter, the number of a telephone service supplier is called from host terminal 1, which puts the adaptive interface 30 in connection with the telephone service's computer RT. Via this computer, an automatic adjustment of the host terminal 1 to the headset 2 must be carried out.

An adaptation procedure is initiated and controlled by the coupled computer RT.

During this procedure, the selected adjustments in the form of relevant working parameters and digital calculation operations are transferred to the adaptive interface and stored in the EEPROM 18.

A first procedure for the adjustment of the adaptive headset can now take place in the following manner, cf. FIGS. 7 and 8:

The coupled computer transmits a characteristic signal to the host terminal, and the adaptive headset interface transmits a characteristic signal on its output.

A changeover procedure changes the line sequence on the connections between the host terminal and the headset interface until correct signals are detected by the computer and interface, respectively.

Reference is now made to FIG. 7:

The user places the connections for the host terminal's handset parallel-coupled with the interface's port to the host terminal, and places the headset so that the handset's loudspeaker lies close to the headset's microphone, and the handset's microphone lies close to the headset's loudspeaker.

There is now transmitted a reference signal (S1A) by the adaptive interface across the headset's loudspeaker, corresponding to a reference sound pressure (R3), which is detected by the handset's microphone and transmitted further to the (N) coupled computer over the telephone line (N), upon which the adaptive interface expects to receive an instruction (I1A) from the computer, in accordance with which the interface adjusts the amplification of signals which are transmitted from the adaptive headset to the host terminal.

Hereafter, via the loudspeaker of the handset and the headset's microphone, the adaptive interface receives a reference signal (S1B) from the coupled computer corresponding to a reference sound pressure (R4). The processor unit now adjusts the amplification of signals received from the host terminal.

In connection with the existing headset, the adaptive headset interface will thus operate at signal levels which are identical to those of the host terminal and, providing that the procedure is implemented correctly and that the host terminal complies with valid standards, it will hereby be ensured that the connected headset is in accordance herewith.

As an alternative to the procedure described with reference to FIG. 7, the adjustment procedure can be effected in the following manner, cf. FIG. 8:

The adaptive interface transmits a specific electrical signal (S2A), corresponding to a pre-defined reference sound pressure (R1) at the microphone of the headset, to the coupled computer over the telephone line (N), upon which the adaptive interface will expect to receive an instruction (I2A) from the computer, in accordance with which the adaptive interface adjusts the amplification of signals which are sent from the headset to the host terminal.

The adaptive interface will then receive a signal (S2B) from the coupled computer over the telephone line (N), corresponding to a second reference sound pressure (R2), in accordance with which the adaptive interface adjusts the amplification of signals which are sent from the coupled computer and received by the headset, so that the existing headset and the adaptive interface will operate at signal levels at which attenuation and loss in a specific telephone line, corresponding to the telephone line (N), are compensated for.

If the suppliers of the telephone service are able to couple a random host terminal from a random point on the net to the service suppliers' reference terminal, or to one of their reference terminals, over a number of different lines, e.g. of different country-specific reference lengths, or by means of models which represent these different line lengths, the relevant headset and the relevant host terminal will operate as if in accordance with these with a tolerance which depends on the transducer tolerance, and how close the coupled telephone line (N) is to the country-specific reference.

Hereafter, a "personal" adjustment procedure can be initiated, whereby the user is led through various options for sound setting by an interactice session which can be based on synthetic speech and the recording of entries made at the keyboard of the host terminal. For example, the options can be chosen on the basis of comparable sound tests which can be selected by the user in accordance with the user's personal preferences.

What is claimed is:

1. An adaptive headset interface comprising:
   a port with connections for connecting to a handset in a host telephone terminal;
   a port with connections for connecting to a loudspeaker and a microphone, respectively, in a headset;
   an amplifier unit including separate input and output amplifiers for the host terminal ports;
   a processor unit including A/D and D/A converters for the respective inputs and outputs of the host terminal and headset ports, the processor unit controls the amplifiers via a series of control signals;
   a digital processor means having programmable digital calculation operations;
   a power supply unit, a clock unit and a memory unit connected to the processor unit, whereby the amplifier unit and the processor unit form a receiving and a transmitting signal path, respectively, connecting the respective inputs and outputs for the host and the headset terminals;
   the processor unit further comprises a modem block, and the interface is provided with changeover means controlled by the processor unit to effect a change between the output and input terminal port connections to a set of connector terminals, the digital processor unit being coupled to a computer when a call is made via the modem block to a supplier of a telephone service over a telephone line, the processor unit initiates a changeover procedure via the changeover means during transmission of pre-defined signals of the respective inputs and outputs, to change between the connector terminals to achieve a correct connection of the host terminal, the interface and the headset, after which the processor unit is adjusted through received programming from the coupled computer by a user of the headset, during which test signals and instructions are exchanged between the adaptive interface and the computer over a coupled telephone line; and the host terminal handset is coupled in parallel with an interface port to the host terminal, the loudspeaker of the handset is placed close to the microphone of the headset, the microphone of the handset is placed close to the loudspeaker of the headset, a reference signal over the loudspeaker of the headset is detected by the microphone of the handset, and is sent further to the coupled computer, the processor unit is programmed to expect to receive an instruction from the computer, and in accordance with the instruction received from the computer, is programmed to adjust amplification in the transmitting signal path.

2. The adaptive headset interface according to claim 1, wherein the amplifier unit comprises separate input and output amplifiers for the headset ports which are controlled by the processor unit, the receiving signal path, and the transmitting signal path, and the respective input and output amplifiers for the two signal paths are substantially symmetrically configured.

3. The adaptive headset interface according to claim 1, wherein the processor unit is programmed to transmit, during a first adjustment procedure, a specific signal on the transmitting signal path, corresponding to a first predefined reference sound pressure at the microphone of the headset, over the telephone line to the coupled computer, and the processor unit is programmed to expect to receive an instruction from the computer, and the processor unit is programmed to adjust amplification in the transmitting signal path in accordance with the instruction from the computer.

4. The adaptive headset interface according to claim 1, wherein the digital processor unit is programmed to receive, during a second adjustment procedure, a signal from the coupled computer over the telephone line, corresponding to a second reference sound pressure at a reference terminal connected to the computer, and the processor unit is programmed to adjust amplification in the receiving signal path in accordance with the signal received.

5. The adaptive headset interface according to claim 1, wherein the digital processor unit is programmed to transmit, during a third adjustment procedure, a third reference sound pressure is sent to the coupled computer, and in accordance with the instruction received from the computer, is programmed to adjust amplification in the transmitting signal path.

6. The adaptive headset interface according to claim 1, wherein the processor unit is programmed to receive, during a fourth adjustment procedure, and the host terminal handset is coupled in parallel with an interface port to the host terminal, and the loudspeaker of the handset is placed close to the microphone of the headset, and the microphone of the handset is placed close to the loudspeaker of the head set, a reference signal, corresponding to a fourth reference sound pressure, from a reference terminal connected to the coupled computer via the loudspeaker of the handset of the host terminal and the microphone of the headset, and the processor unit is programmed to adjust amplification in the receiving signal path in accordance with the reference signal received.

7. The adaptive headset interface according to claim 1, wherein the processor unit is programmed to effect an interactive session between a user of the headset and the computer, based on keying-in of numbers and synthetic speech.

8. Method for adjustment of an adaptive headset interface, during which a host terminal's handset is coupled in parallel with the interface's port to the host terminal, and where a handset's loudspeaker is placed close to the headset's microphone, and the handset's microphone is placed close to the headset's loudspeaker of the head set, and whereby a reference signal is transmitted by the adaptive interface over the headset's loudspeaker, corresponding to a reference sound pressure, which is detected by the handset's microphone, and which is transmitted further to a computer coupled over a telephone line, upon which the adaptive interface expects to receive an instruction from the computer, after which the interface adjusts the amplification of signals which are transmitted from the adaptive headset to the host terminal, and whereupon the adaptive interface receives a reference signal, corresponding to a reference sound pressure from the coupled computer via the loudspeaker of the handset and the headset's microphone, in accordance with which the processor unit adjusts the amplification of signals received from the host terminal, so that in connection with the existing headset, the adaptive headset interface will operate at signal levels which are identical to those of the host terminal.

9. A method for adjustment of an adaptive interface comprising;

transmitting via a host terminal handset a specific electrical signal by the adaptive interface, corresponding to a pre-defined reference sound pressure at a microphone of a headset, to a computer coupled over a telephone line;

the adaptive interface will expect to receive an instruction from the computer;

adjusting amplification of signals which are sent from the headset to the host terminal handset by the adaptive interface;

receiving a signal from the coupled computer over the telephone line corresponding to a second reference sound pressure by the adaptive interface;

adjusting amplification of signals which are sent from the coupled computer via the handset and received by the headset by the adaptive interface; and operating the existing headset and the adaptive interface at signal levels adapted for communication over telephone lines corresponding to the telephone line.

10. Method whereby an adaptive interface is adjusted to a host terminal according to claim 8, whereby prior to the adjustment procedure for the adaptation of signal levels, a changeover procedure is carried out whereby a headset interface's physical connections to a host terminal are changed via changeover means during transmission of characteristic signals for the respective connections by the adaptive interface and the coupled computer, respectively, until correct connection is achieved.

* * * * *

UNITED STATES PATENT AND TRADEMARK OFFICE
CERTIFICATE OF CORRECTION

PATENT NO. : 6,718,034 B1 Page 1 of 1
DATED : April 6, 2004
INVENTOR(S) : Larsen It is certified that error appears in the above-identified patent and that said Letters Patent is hereby corrected as shown below:

<u>Title page,</u>
Item [73], Assignee, should read:
-- [73] Assignee: GN Netcom A/S, Ballerup, Denmark --

Signed and Sealed this

Ninth Day of November, 2004

JON W. DUDAS
*Director of the United States Patent and Trademark Office*